United States Patent
Schruefer

(10) Patent No.: US 7,491,612 B2
(45) Date of Patent: Feb. 17, 2009

(54) FIELD EFFECT TRANSISTOR WITH A HETEROSTRUCTURE AND ASSOCIATED PRODUCTION METHOD

(75) Inventor: Klaus Schruefer, Baldham (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 11/473,430

(22) Filed: Jun. 23, 2006

(65) Prior Publication Data

US 2007/0013002 A1 Jan. 18, 2007

Related U.S. Application Data

(63) Continuation of application No. PCT/EP2004/053132, filed on Nov. 26, 2004.

(30) Foreign Application Priority Data

Dec. 23, 2003 (DE) ................... 103 60 874

(51) Int. Cl.
*H01L 21/336* (2006.01)
(52) U.S. Cl. .............. 438/285; 438/590; 438/752; 438/933; 438/936; 257/19; 257/20; 257/24; 257/190; 257/191; 257/192; 257/194; 257/616; 257/E29.049; 257/E29.056
(58) Field of Classification Search .......... 438/285, 438/590, 752, 933, 936; 257/19, 20, 24, 257/190–192, 194, 616, E29.049, E29.056
See application file for complete search history.

(56) References Cited

U.S. PATENT DOCUMENTS

| 5,534,713 | A | 7/1996 | Ismail et al. | |
|---|---|---|---|---|
| 6,059,895 | A | 5/2000 | Chu et al. | |
| 6,350,993 | B1 | 2/2002 | Chu et al. | |
| 6,815,738 | B2 * | 11/2004 | Rim | 257/256 |
| 2002/0179946 | A1 | 12/2002 | Hara et al. | |
| 2003/0162335 | A1 | 8/2003 | Yuki et al. | |
| 2003/0201497 | A1 | 10/2003 | Inoue et al. | |
| 2004/0142541 | A1 * | 7/2004 | Cohen et al. | 438/479 |

FOREIGN PATENT DOCUMENTS

| EP | 1 298 712 A2 | 4/2003 |
|---|---|---|
| JP | 07-321222 | 12/1995 |
| JP | 09082944 A | 3/1997 |

(Continued)

OTHER PUBLICATIONS

Bean, John C., "Silicon-Based Semiconductor Heterostructures: Column IV Bandgap Engineering," *Proceedings of the IEEE*, vol. 80, No. 4, Apr. 1992, pp. New York, pp. 571-587.

(Continued)

*Primary Examiner*—Andy Huynh
(74) *Attorney, Agent, or Firm*—Brinks Hofer Gilson & Lione

(57) ABSTRACT

A field effect transistor with a heterostructure includes a strained monocrystalline semiconductor layer formed on a carrier material, which has a relaxed monocrystalline semiconductor layer made of a first semiconductor material (Si) as the topmost layer. The strained monocrystalline semiconductor layer has a semiconductor alloy (GexSi1-x), where the proportion x of a second semiconductor material can be set freely. Furthermore, a gate insulation layer and a gate layer are formed on the strained semiconductor layer. To define an undoped channel region, drain/source regions are formed laterally with respect to the gate layer at least in the strained semiconductor layer. The possibility of freely setting the Ge proportion x enables a threshold voltage to be set as desired, whereby modern logic semiconductor components can be realized.

7 Claims, 7 Drawing Sheets

FOREIGN PATENT DOCUMENTS

| | | |
|---|---|---|
| JP | 10-308503 | 11/1998 |
| JP | 2002-280568 | 9/2002 |
| JP | 2004-266064 | 9/2004 |

OTHER PUBLICATIONS

Loo et al., "Fabrication of 50 nm high performance strained-SiGe pMOSFETs with selective epitaxial growth," (available online at www.sciencedirect.com), *Applied Surface Science* 224, (2004) pp. 292-296.

Shima et al., "<100> Channel Strained-SiGe p-MOSFET with Enhanced Hole Mobility and Lower Parasitic Resistance," 2002 Symposium on VLSI Technology Digest of Technical Papers, pp. 94-95.

Takagi et al., "A Novel High Performance SiGe Channel Heterostructure Dynamic Threshold Pmosfet (HDTMOS)," IEEE Electron Device Letters, vol. 22, No. 5, May 2001, pp. 206-208.

Yeo et al., "Enhanced Performance in Sub-100 mn CMOSFETs Using Strained Epitaxial Silicon-Germanium," paper, Department of Electrical Engineering and Computer Sciences, University of California, Berkley, CA, IEDM 00-753-756-IEDM 00, pp. 32.5.1-32.5.4.

Japanese Patent Application No. 2006-546144 Office Action dated Mar. 18, 2008 in English translation.

German Office Action (in the German language) dated Aug. 5, 2008, for corresponding German patent application No. 103 60 874.5.

* cited by examiner

US 7,491,612 B2

FIELD EFFECT TRANSISTOR WITH A HETEROSTRUCTURE AND ASSOCIATED PRODUCTION METHOD

PRIORITY CLAIM

The present patent document is a continuation of International Application Ser. No. PCT/EP2004/053132, filed Nov. 26, 2004, and claims the benefit of priority of German Patent Application No. DE 10360874.5, filed Dec. 23, 2003, both of which are incorporated by reference herein.

BACKGROUND

1. Technical Field

The present invention relates to a field effect transistor with a heterostructure and to an associated production method, and in particular to a sub-100 nm field effect transistor with a fully depleted active region.

2. Background Information

As the development of semiconductor components, and in particular field effect transistors, advances, ever shrinking feature sizes are striven for in order to improve an integration density and switching speed. However, specific limits are encountered in this case on account of a limited charge carrier mobility in semiconductor materials. Since an upper limit of the charge carrier mobility of electrons and holes in a semiconductor crystal depends on the physical properties of the semiconductor crystal, the switching speed of the field effect transistors is inherently limited by the semiconductor crystal. Furthermore, so-called high-k gate dielectrics (that is to say dielectrics having a high dielectric constant) that are necessary for the rising integration density also cause a reduced charge carrier mobility.

Therefore, so-called field effect transistors with stress-absorbing or strained semiconductor layers have been developed, whereby it is possible to improve a charge carrier mobility in a strained semiconductor crystal.

In modern logic chips, such as, for example, microcontrollers, microprocessors, telecommunications chips, etc., a significant requirement furthermore consists in being able to set the threshold voltage (Vt) of the field effect transistors (n/p-MOS) highly precisely in a manner adapted to a respective application. In the case of conventional, for example CMOS, field effect transistors with their n+/p+-polycrystalline gate electrodes, said threshold voltage is usually set by way of the substrate doping. In the case of the fully depleted semiconductor structures or "fully depleted silicon on insulator" structures discussed below, however, it is no longer possible to adopt the usual manner of setting said threshold voltage of the field effect transistors by way of a substrate doping, since the statistical variation of the dopants in the small active volume would lead to extremely severe fluctuations in the threshold voltage that are unacceptable to circuit designers. Furthermore, it is also no longer possible to use n/p doped polysilicon as the gate electrode, since these materials lead to extremely low threshold voltages and are thus unsuitable for future logic components.

One method for eliminating these problems is to set the threshold voltage of a field effect transistor by varying the gate capacitance. This exploits the circumstance that the threshold voltage of the field effect transistor increases as the gate capacitance decreases.

A further method for setting a threshold voltage of field effect transistors conventionally consisted in suitably altering the so-called flat band voltage, which essentially depends on the difference between the work functions of the gate electrode and the substrate material. For an undoped FD-SOI structure (fully depleted silicon on insulator), by way of example, a gate electrode made of metal having a work function of 4.7 eV leads to symmetrical threshold voltages for the n and p MOS field effect transistors. However, this approach leads to very high threshold voltages of approximately 500 mV for n- and p-MOS field effect transistors and is therefore not suitable for future logic components. Conventional methods and field effect transistors of this type cannot be used in particular for so-called ASICs (application specific integrated circuit) or microprocessors for which a threshold voltage of the field effect transistors of at most 350 mV is necessary.

In principle, it could furthermore be attempted to alter the work function of the gate electrodes for example by means of implanting suitable dopants or by using different metals or metal alloys in such a way as to produce a suitable or sufficiently small threshold voltage. However, extremely great difficulties arise here in terms of actually finding the exactly correct materials and integrating them in a CMOS process. In particular the requirements made of a symmetrical threshold voltage in a CMOS circuit for both n and p MOS field effect transistors lead to extremely cost-intensive solutions.

BRIEF SUMMARY

Therefore, the invention is based on the object of providing a field effect transistor with a heterostructure and also an associated production method, in which case a threshold voltage of the field effect transistor can be set highly precisely in a simple and cost-effective manner.

According to the invention, this object is achieved by means of the features of patent claims 1 and 3 with regard to the field effect transistor and by means of the measures of patent claim 13 with regard to the method.

In accordance with a first alternative, a field effect transistor accordingly has a carrier material which has a relaxed monocrystalline semiconductor layer made of a first semiconductor material as the topmost layer. A strained monocrystalline semiconductor layer is formed on the relaxed semiconductor layer, said strained monocrystalline semiconductor layer having a semiconductor alloy comprising the first semiconductor material and at least one second semiconductor material, where a proportion of the second semiconductor material can be set freely. There is situated on the strained semiconductor layer a gate insulation layer and a gate layer, in which case, in order to define an undoped channel region, drain/source regions are formed laterally with respect to the gate layer at least in the strained semiconductor layer. Through the alteration of the proportion of the second semiconductor material within the strained monocrystalline semiconductor layer comprising a semiconductor alloy, a threshold voltage of the field effect transistor can now be set very precisely. The advantageous properties of a high charge carrier mobility on account of the strained semiconductor material continue to be utilized in this case.

In accordance with a second alternative, a further relaxed monocrystalline semiconductor layer may furthermore be inserted between the topmost layer of the carrier material and the strained monocrystalline semiconductor layer comprising a semiconductor alloy having a freely settable proportion of the second semiconductor material, said further relaxed monocrystalline semiconductor layer being formed on the first relaxed semiconductor layer and having a further semiconductor alloy comprising the first semiconductor material and at least one second semiconductor material, where a further proportion of the second semiconductor material within the further semiconductor alloy can in turn be set freely. Furthermore, a further strained monocrystalline semiconductor layer, which in turn comprises the first semiconductor material, is formed at the surface of said further relaxed semiconductor layer. In this way, it is possible to compensate for the asymmetries that arise on account of asymmetrical band edge discontinuities for p- and n type field effect transistors, as a result of which, for an identical gate electrode material and for identical substrate materials, symmetrical threshold voltages are obtained both for n type and for p type field effect transistors. High-quality CMOS circuits can thereby be produced particularly simply.

The sum of the thicknesses of the relaxed and strained semiconductor layers is preferably less than a third of the length of the channel region, as a result of which so-called fully depleted semiconductor structures are reliably obtained.

The gate layer preferably has a metallic material with a work function of 4.5 eV to 4.9 eV and preferably of 4.7 eV, which is also referred to as a so-called "mid gap" metal.

Preferably, silicon is used as the first semiconductor material and germanium as the second semiconductor material, as a result of which, using readily controllable materials, the required semiconductor alloys can be set sufficiently precisely with regard to their proportions.

By way of example, an SOI substrate (silicon on insulator) is used as the carrier material, in which case it also possible to use a silicon substrate with a buried SiO2 layer as "buried oxide".

In order to realize a suitable gate capacitance, SiO2 or a so-called high-k dielectric is furthermore used, as a result of which either production can be greatly simplified or the gate capacitance can be greatly increased.

The layer thicknesses of the strained semiconductor layers are preferably chosen in such a way that it is possible to ensure a stable stress or a stable strain for Ge proportions x of up to 0.5. Given such layer thicknesses, it is possible to realize channel lengths of up to approximately 20 to 30 nm from an electrostatic standpoint (short channel effects).

The field effect transistor is preferably used for a CMOS circuit, in which case, using the same materials for the layer structure of the field effect transistor, a symmetrical threshold voltage results for the n type and for the p type field effect transistor.

With regard to the method for producing a field effect transistor with a heterostructure, preferably firstly a carrier material is prepared, which has a relaxed monocrystalline semiconductor layer made of a first semiconductor material as the topmost layer. Afterward, a strained monocrystalline semiconductor layer is formed at the surface of the relaxed semiconductor layer, said strained monocrystalline semiconductor layer having a semiconductor alloy comprising the first semiconductor material and at least one second semiconductor material where a proportion of the second semiconductor material can be set freely. At the surface of the strained semiconductor layer, a gate insulation layer and a gate layer are subsequently formed, in which case, in order to define an undoped channel region, finally, drain regions and source regions are formed laterally with respect to the gate layer at least in the strained semiconductor layer. The production of a field effect transistor with a threshold voltage that can be set freely is accordingly very simple and cost-effective.

It is once again possible, in order to realize symmetrical threshold voltages for n and p type field effect transistors with the use of identical materials, additionally to insert a further relaxed monocrystalline semiconductor layer, which comprises a further semiconductor alloy that can be set freely, and an additional strained monocrystalline semiconductor layer, which comprises the first semiconductor material, between the topmost layer of the carrier material and the strained monocrystalline semiconductor layer comprising the semiconductor alloy, where a proportional ratio of the additionally inserted semiconductor alloy can also be set freely in order to symmetrize the threshold voltages.

Preferably an epitaxy method and in particular molecular beam epitaxy is used for forming the strained and relaxed semiconductor layers on the carrier material, as a result of which very small layer thicknesses can be produced extremely precisely and relatively simply.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION

The invention is described by way of example below on the basis of a field effect transistor with a heterostructure, Si being used as the first semiconductor material, Ge being used as the second semiconductor material and GexSi1-x being used as the semiconductor alloy. However, it is not restricted thereto and encompasses field effect transistors having alternative semiconductor materials in the same way.

Figure 1:
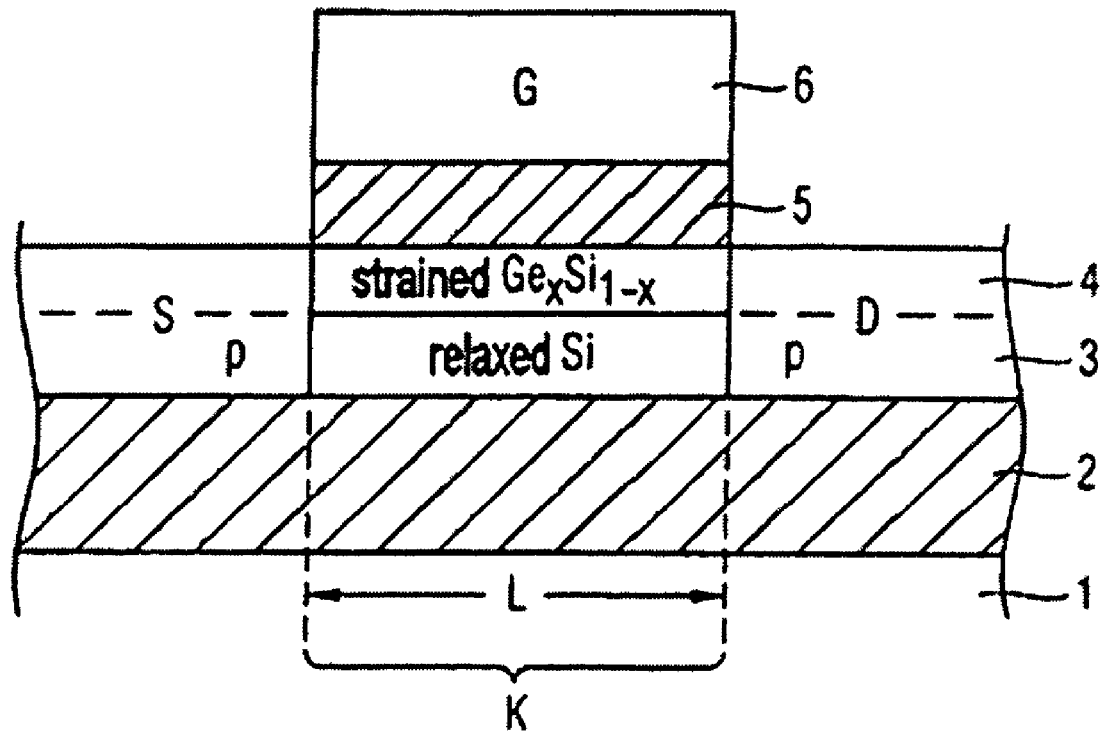
FIG. 1 shows a simplified sectional view of a field effect transistor with a heterostructure.

FIG. 1 shows a simplified sectional view for illustrating a field effect transistor with a heterostructure in accordance with a first exemplary embodiment.

By way of example, a so-called SOI substrate (silicon on insulator) having a semiconductor substrate 1, a thin insulation layer 2 formed thereon and a semiconductor layer 3 formed thereon is used as the carrier material for the field effect transistor according to the invention. The semiconductor substrate 1 comprises silicon, for example, the insulation layer 2 comprising SiO2 and the topmost layer 3 having a relaxed monocrystalline semiconductor layer made of silicon.

The terms relaxed and strained semiconductor layer that are used repeatedly hereinafter relate in this case to monocrystalline semiconductor layers which are relaxed or strained on account of external boundary conditions, as a result of which their electrical properties are altered.

As an alternative to the SOI substrate, the carrier material used may also be a conventional semiconductor wafer, in the surface region of which a buried insulation layer is formed as an insulation layer 2 by means of oxygen implantation, by way of example. Buried insulation layers of this type are also referred to as "buried oxide".

The relaxed semiconductor layer 3 comprises a first semiconductor material (e.g. Si) and has a thickness of 3 to 5 nm, in which case the layer thickness may furthermore be set to a desired layer thickness by means of epitaxial semiconductor growth, by way of example.

A strained monocrystalline semiconductor layer 4 is then formed at the surface of the relaxed semiconductor layer 3, preferably by means of a deposition method, said strained monocrystalline semiconductor layer having a semiconductor alloy comprising the first semiconductor material of the relaxed semiconductor layer 3, that is to say silicon, and at least one second semiconductor material, such as germanium for example. This results in a so-called IV IV semiconductor alloy $Ge_xSi_{1-x}$. The proportion x of the second semiconductor material or of the germanium can be set freely during this deposition operation, in which case the accuracy of the setting can be defined very easily by means of the process parameters. The deposition method used is preferably an epitaxial method, and in particular so-called molecular beam epitaxy.

By virtue of the capability of freely setting the germanium proportion x, it is now possible for the threshold voltage of the field effect transistor to be varied in a region of 450 mV and set highly precisely, as is explained in detail below.

Firstly, however, a brief description will also be given of further production steps for completing the field effect transistor. After the formation of the strained semiconductor layer 4, which likewise has a thickness of approximately 3 to 5 nm, a gate insulation layer 5 having, by way of example, SiO2 or a so-called "high-k dielectric" is subsequently formed. The advantages of such dielectrics having a particularly high dielectric constant are that a gate capacitance that is essential for the threshold voltage can thereby be increased. In principle, it is also possible to use other materials and in particular multilayer structures such as, for example, ONO layer sequences (oxide-nitride-oxide) as the gate insulation layer 5. The thickness of said layer 5 lies in a range of 1 to 10 nm and preferably has a value of 1 to 2 nm.

A gate layer 6 is subsequently formed at the surface of the gate insulation layer 5, preferably metallic materials and in particular so-called "mid gap" metals with a work function of 4.5 eV to 4.9 eV being used. In particular for the semiconductor materials germanium and silicon used, it is appropriate to give consideration to a "mid gap" metal with a work function of 4.7 eV for realizing symmetrical threshold voltages for the n- and p-MOS field effect transistor. Accordingly metallic materials such as, for example, NiSi, TiN, CoSi, etc. are possible for the gate layer 6 or the gate electrode G. The thickness of said gate layer 6 is 100 nm, by way of example.

After the formation of said gate insulation layer 5 and the gate layer 6, a patterning known from the prior art is then effected for the purpose of forming a patterned gate stack, the gate stack in accordance with FIG. 1 being formed for example using photolithographic methods and a subsequent etching technique. Afterward, using spacers (not illustrated), an ion implantation may be carried out using the gate stack as a mask, as a result of which source regions S and drain regions D are formed at least in the strained semiconductor layer 4 but also in the relaxed semiconductor layer 3.

A field effect transistor having an undoped channel K which is defined laterally by the drain/source regions D and S and is delimited with regard to its height by the insulation layer 2 and the gate insulation layer 5 is obtained in this way. In order to realize so-called "fully depleted" field effect transistors, the sum of the thicknesses of the relaxed and strained semiconductor layers 3 and 4 is less than a third of the length L of the channel region K.

According to the invention, the threshold voltage in particular of FD-SOI field effect transistors (fully depleted silicon on insulator) can thus be set arbitrarily and highly precisely by way of changing the semiconductor proportions of a semiconductor alloy in the strained layer 4. This will be explained in greater detail specifically with reference to FIGS. 2 to 4.

Figure 2A:
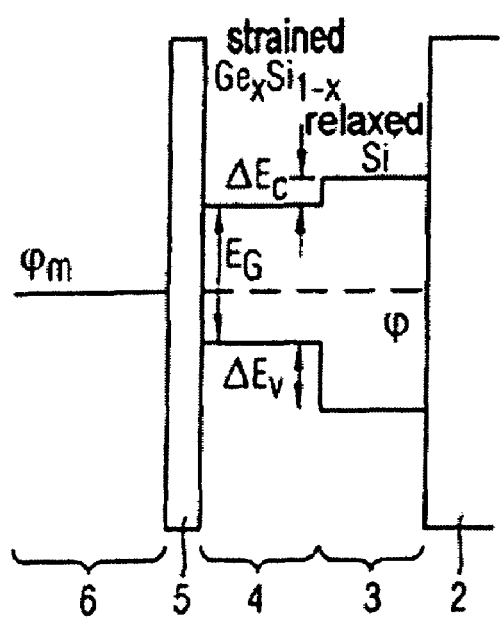
FIGS. 2A and 2B show a simplified illustration of the band edge profile of the field effect transistor in accordance with FIG. 1 for the case of a flat band voltage and an inversion.
Figure 2B:
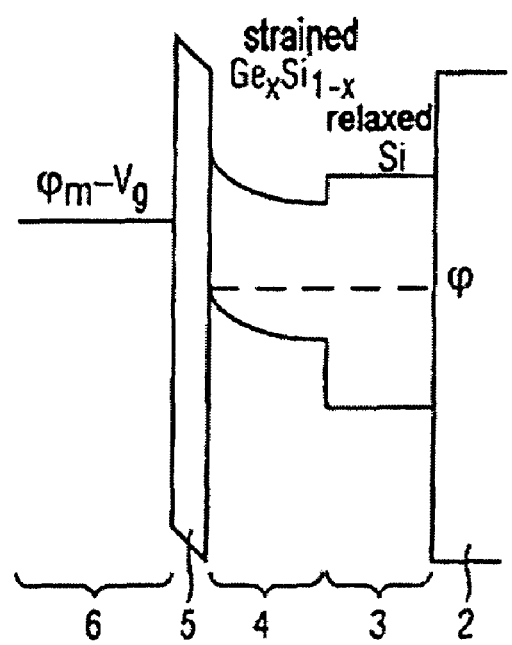

FIGS. 2A and 2B respectively show a simplified illustration for illustrating a schematic band edge profile of the layer structure illustrated in FIG. 1 in the case of a flat band voltage, that is to say upon application of a voltage at which the valence and conduction bands exhibit a flat profile, and—in accordance with FIG. 2B—in the case of inversion, that is to say application of a voltage Vg at the gate layer 6, for a p MOS field effect transistor. In this case, f indicates the Fermi level of the semiconductor, while fm shows the Fermi level of the metallic gate layer 6, which corresponds to the conduction band edge in the case of metals. EG respectively designates the bandgap, which essentially defines an energy required for "raising" an electron from the valence band into the conduction band. Furthermore, ΔEc and ΔEV represent the respective band edge discontinuities for the conduction band and the valence band which in each case result at the transition between the relaxed silicon 3 and the strained $Ge_xSi_{1-x}$ semiconductor alloy.

Figure 3:
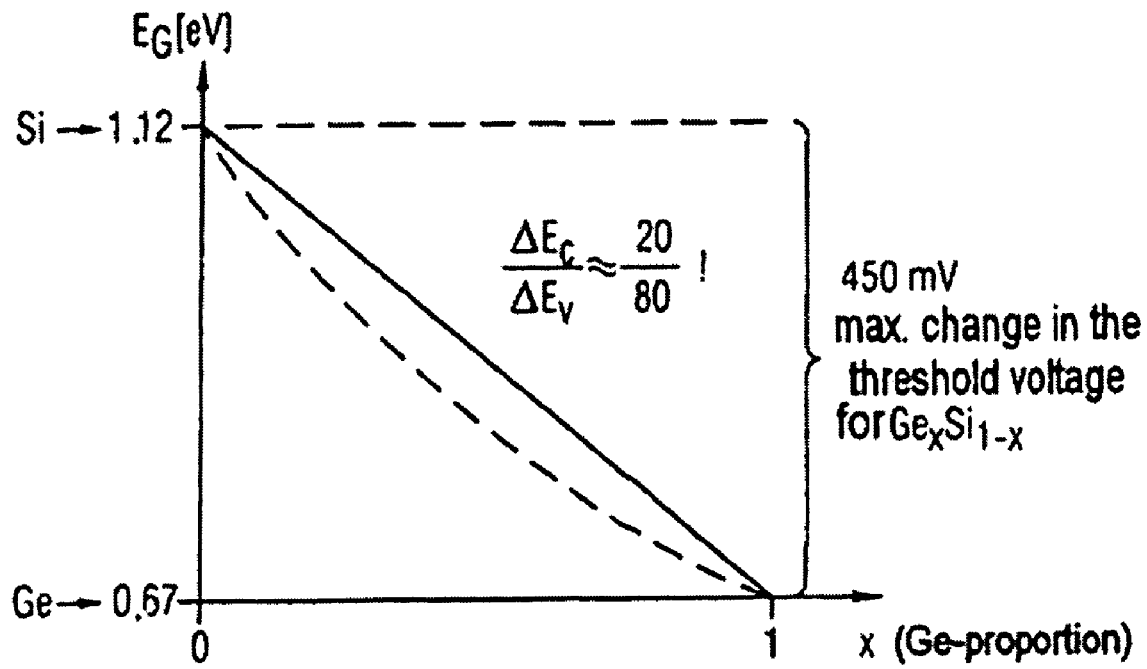
FIG. 3 shows a simplified illustration for illustrating the relationship of bandgap and Ge proportion for a GexSi1-x semiconductor alloy.

FIG. 3 then shows a graphical illustration for illustrating the behavior of such a bandgap EG as a function of a respective proportion x of the second semiconductor material or the Ge proportion. In accordance with FIG. 3, given a germanium proportion x of 0, the bandgap EG is identical to that of silicon and is accordingly 1.12 eV. On the other hand, given a germanium proportion x of 1 (100%), a pure germanium semiconductor crystal is present, for which reason the bandgap EG of germanium at 0.67 eV is attained. By altering the germanium proportion 0<x<1 within the semiconductor alloy of the strained semiconductor layer 4, it is accordingly possible to set a bandgap EG in accordance with FIG. 2A highly precisely, as a result of which the threshold voltage illustrated in FIG. 2B, which signifies inversion in the strained semiconductor layer 4, is defined. Upon application of a predetermined voltage Vg the bands are accordingly bent in such a way that the valence band of the strained layer 4 at the surface to the gate insulation layer 5 finally reaches as far as the Fermi level f and inversion is thus present. The channel of the field effect transistor becomes conducting at this point in time, as a result of which the threshold voltage is defined.

In accordance with FIG. 3, it is accordingly possible, in a field effect transistor in accordance with the first exemplary embodiment, by means of a targeted change in the germanium proportion x, to alter the bandgap in such a way as to finally produce a targeted change in the threshold voltage.

Figure 4:
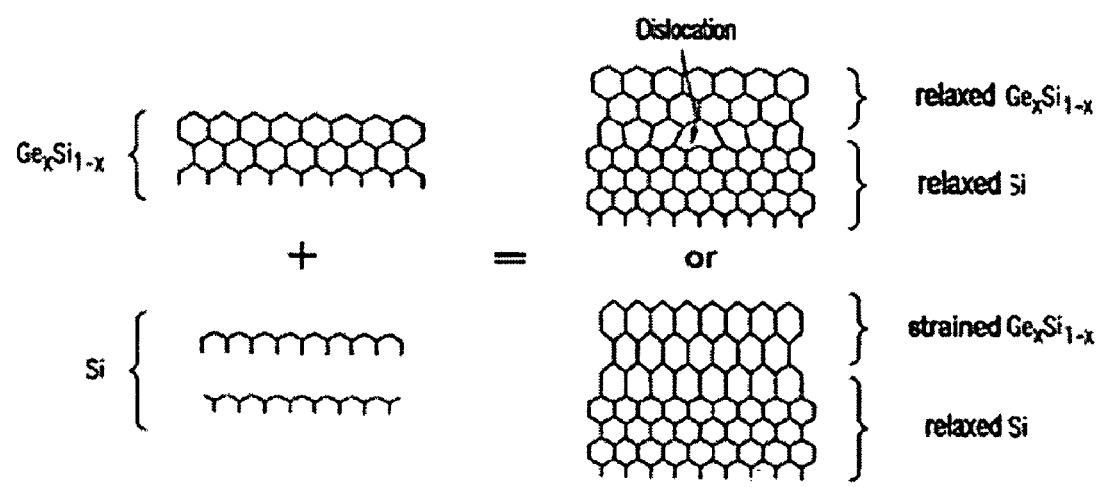
FIG. 4 shows a simplified illustration for illustrating the production possibilities for strained and relaxed semiconductor layers.

FIG. 4 shows a simplified illustration for illustrating the different possibilities for crystal growth and in particular for realizing a relaxed semiconductor layer on a relaxed starting material or a strained semiconductor layer on a relaxed starting material. Accordingly, the semiconductor alloy $Ge_xSi_{1-x}$ has a larger crystal structure or lattice constant than the semiconductor material Si. If these layers are then joined together, the crystal structures illustrated on the right-hand side may arise, and, either on account of dislocations and surface defects at the boundary layer, a relaxed GexSi1-x layer is formed on a relaxed Si layer or, in the case illustrated underneath, no dislocations of this type are present at the boundary layer and, consequently, the different lattice constants of the crystals are adapted to one another with the occurrence of mechanical strains or stress. In the case illustrated, this results in a strained GexSi1-x semiconductor alloy formed on a relaxed Si layer. More detailed information on such semiconductor heterostructures can be found in particular in the literature reference John C. Bean: "Silicon-Based Semiconductor Heterostructures: Col. IV Bandgap Engineering", Proceedings of IEEE, Vol. 80, No. 4, April 1992.

Since the threshold voltage depends on the distance between the Fermi level f and the conduction/valence band edge of the semiconductor, it is thus possible, by means of the Ge proportion x, to set the threshold voltage variably around approximately 200 mV for the n/p-MOS field effect transistor. Since, however, in the case of strained GexSi1-x on unstrained Si, the band edge discontinuity is shared between the conduction band at 20% and the valence band at 80%, the asymmetrical threshold voltage in FIGS. 2A and 2B is obtained for an n type and p type field effect transistor. Through selection of a suitable metal for the gate layer 6 with a work function of 4.7 eV −200 mV, it is then possible to shift the threshold voltage of n-type and p-type field effect transistors in the pure silicon by −100 mV or by +100 mV, that is to say e.g. to 400 mV or 600 mV, respectively. In the case of the semiconductor heterostructure proposed in FIG. 1 and FIG. 2, it is accordingly possible, by means of the Ge proportion x, to set the threshold voltage for the n-type and p-type field effect transistor highly precisely to 340 mV and 360 mV, respectively.

Since the selection of such suitable gate layers or "mid gap" metals for the gate electrode is very difficult and often yields only inadequate results, it is possible, in accordance with a second exemplary embodiment, to use an additional relaxed GeySi1-y layer and an additional strained Si layer situated between the relaxed Si and the strained GexSi1-x semiconductor alloy. Symmetrical threshold voltages can thereby also be set using only a single common gate electrode or gate layer and a corresponding composition of the Ge proportions x and y in the semiconductor heterostructure.

Figure 5:
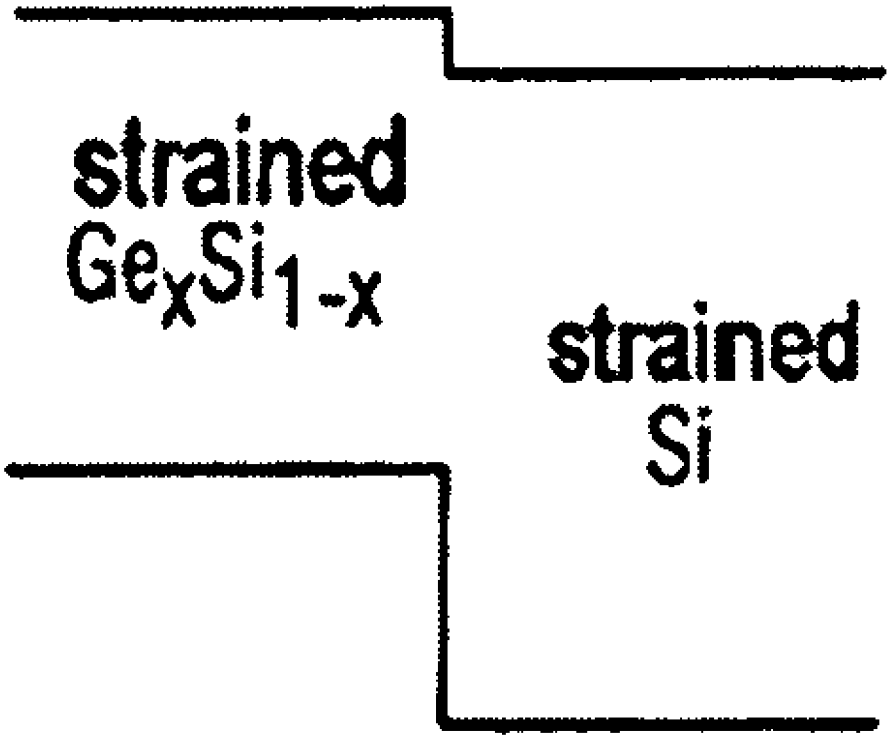
FIG. 5 shows a simplified illustration of a band edge profile for a strained GexSi1-x semiconductor alloy formed on a strained Si semiconductor layer.

FIG. 5 shows a simplified illustration for illustrating a band edge profile for a strained GexSi1-x layer and a strained Si layer. On account of the opposite distribution of the band edge discontinuity between conduction band and valence band, the asymmetries described above can thus be altered in a targeted manner by means of a suitable intermediate layer or by setting a Ge proportion of the intermediate layer.

Figure 6:
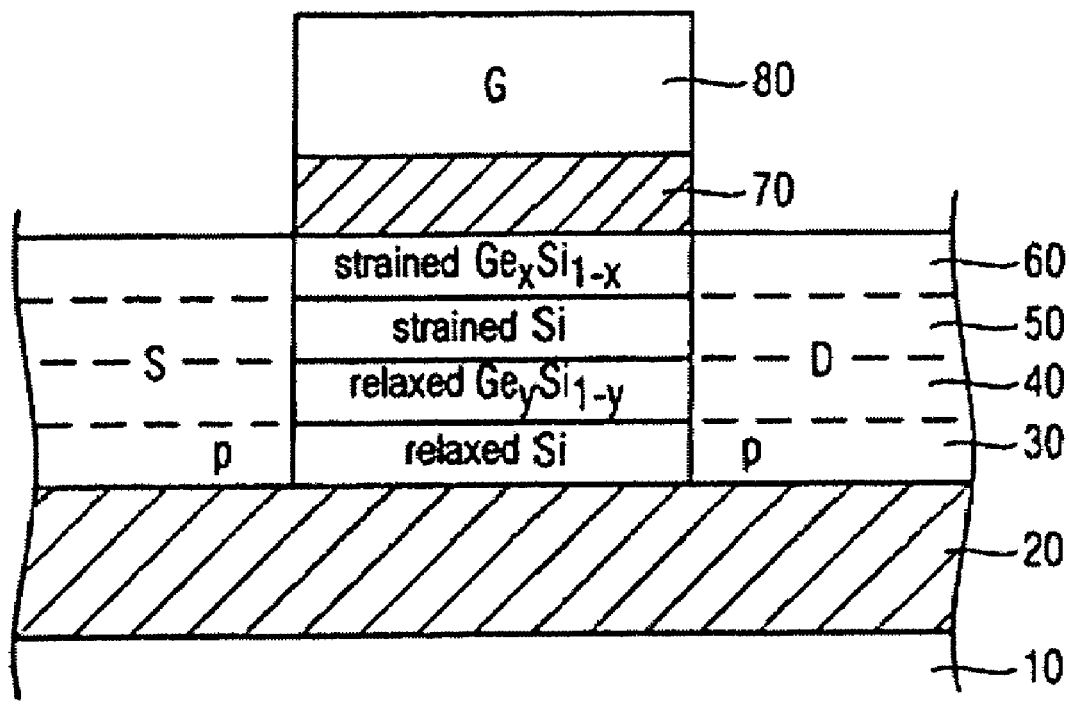
FIG. 6 shows a simplified sectional view of a field effect transistor with a heterostructure.

FIG. 6 shows a simplified sectional view of a field effect transistor in accordance with a second exemplary embodiment, identical reference symbols designating layers identical or corresponding to those in FIGS. 1 to 3, and a repeated description being dispensed with below.

A heterostructure is once again formed on a carrier material having, as the topmost layer, a first relaxed monocrystalline semiconductor layer 30 made of a first semiconductor material, such as silicon for example. The carrier material may in this case once again have either an SOI substrate with a silicon substrate 10 and an insulation layer 20 or a semiconductor substrate with a buried insulation layer (buried oxide).

In contrast to the first exemplary embodiment, however, at the surface of the first relaxed monocrystalline semiconductor layer 30, first a second relaxed monocrystalline semiconductor layer 40 is formed, which has a first semiconductor alloy comprising the first semiconductor material Si and at least one second semiconductor material Ge. To put it more precisely, GeySi1-y as first semiconductor alloy is formed preferably by means of molecular beam epitaxy, in which case once again a germanium proportion y can be set freely for the purpose of compensating for the threshold voltage asymmetry described above. A first strained monocrystalline semiconductor layer 50 having the first semiconductor material, that is to say silicon, is subsequently formed on the second relaxed semiconductor layer 40. Epitaxial methods and in particular molecular beam epitaxy may once again be used in this case. Finally, at the surface of the first strained semiconductor layer 50, a second strained monocrystalline semiconductor layer 60 is formed, which has a second semiconductor alloy comprising the first and second semiconductor materials, that is to say GexSi1-x, where a second proportion x of the second semiconductor material or the second germanium proportion x can once again be set freely.

Figure 7:
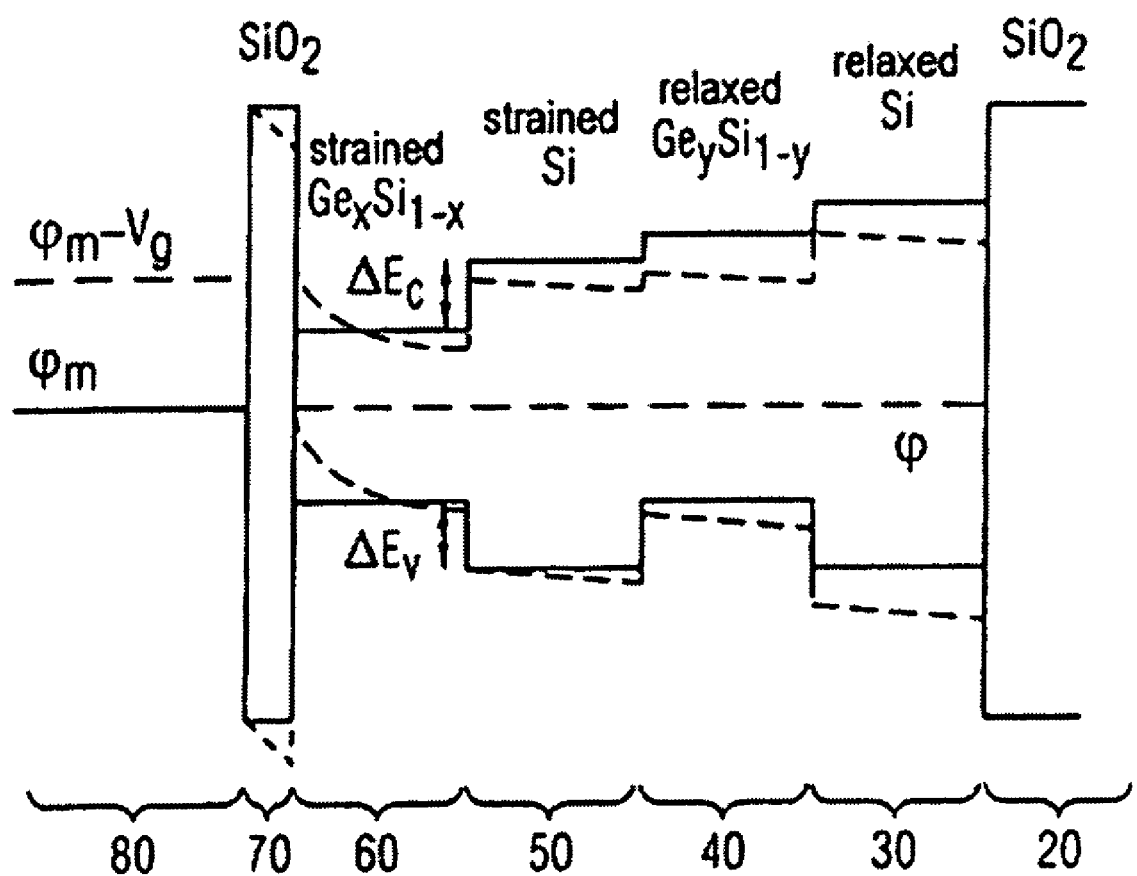
FIG. 7 shows a simplified illustration of a band edge profile of the field effect transistor in accordance with FIG. 6 for the case of a flat band voltage and an inversion.

As a result of the combination of the strained and relaxed semiconductor alloys with their respectively different germanium proportions x and y, it is accordingly possible to realize the symmetrical band edge profile illustrated in FIG. 7, as a result of which, for arbitrary gate materials and arbitrary gate insulation layers 70, it is possible to realize symmetrical threshold voltages for n MOS and p MOS field effect transistors in a simple and cost-effective manner. Particularly when realizing CMOS circuits in which an n type and a p type field effect transistor are in each case combined with one another, it is possible to employ such field effect transistors. In accordance with FIG. 7, the band edge profile in the case of a flat band voltage is illustrated here by solid lines and the band edge profile in the case of inversion is illustrated by dashed lines.

The field effect transistor is once again completed as in the case of the first exemplary embodiment, the patterning of the gate insulation layer 70 and of the gate layer 80 being followed by, for example, an ion implantation for the purpose of forming the source regions S and drain regions D.

With regard to the layer thicknesses, by way of example, a thickness of 3 to 10 nm is set for the first relaxed semiconductor layer 30 and a thickness of 3 to 20 nm and preferably 5 nm is set for the second relaxed semiconductor layer 40. The first strained semiconductor layer 50 has for example a thickness of 3 to 20 nm and preferably a thickness of 3 to 5 nm, while the second strained semiconductor layer 60 has a thickness of 3 to 20 nm and preferably of 3 to 5 nm. The gate insulation layer 70 in turn has a thickness of 1 to 10 nm, while the gate layer 80 may have a thickness of approximately 100 nm.

In particular, it should be pointed out that in the exemplary embodiments described, the layer thicknesses of the respective semiconductor layers are chosen in such a way as to ensure a stable stress or a stable strain for preferably selected germanium proportions of 0 to 0.5 for x and y. Layer thicknesses of this type support channel lengths L of up to approximately 20 to 30 nm in this case from an electrostatic standpoint (short channel effects).

What is obtained in this way is a field effect transistor with a fully depleted channel region whose threshold voltage can be set highly accurately and in a freely selectable manner.

Future logic semiconductor components in particular, such as for example microcontrollers, microprocessors or telecommunications chips having required threshold voltages of the field effect transistors of approximately 350 mV or less, can be produced cost-effectively and in a highly precisely adapted manner in this way. The use of unusual gate materials or different production steps for p and n MOS field effect transistors can thus be obviated.

The invention has been described above on the basis of a fully depleted p type field effect transistor for CMOS circuits which has a strained GexSi1-x semiconductor alloy layer. However, it is not restricted thereto and encompasses alternative field effect transistors having alternative semiconductor materials in the same way.

It is therefore intended that the foregoing detailed description be regarded as illustrative rather than limiting, and that it be understood that it is the following claims, including all equivalents, that are intended to define the spirit and scope of this invention.

I claim:

1. A method for producing a field effect transistor with a heterostructure, comprising: preparing a carrier material, wherein the carrier material includes a first relaxed monocrystalline semiconductor layer made of a first semiconductor material as a topmost layer; forming a second relaxed monocrystalline semiconductor layer at a surface of the first relaxed monocrystalline semiconductor layer, wherein the second relaxed monocrystalline semiconductor layer includes a first semiconductor alloy comprising the first semiconductor material and at least one second semiconductor material, wherein a first proportion y of the at least one second semiconductor material is settable; forming a first strained monocrystalline semiconductor layer at a surface of the second relaxed monocrystalline semiconductor layer, using the first semiconductor material; forming a second strained monocrystalline semiconductor layer at a surface of the first strained monocrystalline semiconductor layer, using a second semiconductor alloy including the first semiconductor material and the at least one second semiconductor material and wherein a second proportion x of the at least one second semiconductor material is settable; forming a gate insulation layer at a surface of the second strained monocrystalline semiconductor layer; forming a gate layer at a surface of the gate insulation layer; patterning the gate layer and the gate insulation layer to form a patterned gate stack; and ion implantating using the patterned gate stack as a mask to form drain/source regions in at least the second strained monocrystalline semiconductor layer, wherein the drain/source regions define an undoped channel region.

2. The method of claim 1, wherein forming the first relaxed monocrystalline semiconductor layer, the second relaxed monocrystalline semiconductor layer, the first strained monocrystalline semiconductor layer, and the second strained monocrystalline semiconductor layer comprises forming by molecular beam epitaxy.

3. The method of claim 2, further comprising setting the x and y proportions of the at least one second semiconductor material in the first semiconductor alloy and the second semiconductor alloy, respectively, dependent on a gate material.

4. The method of claim 2, further comprising setting the x and y proportions of the at least one second semiconductor material in the first semiconductor alloy and the second semiconductor alloy, respectively, dependent on a symmetry requirement for n- or p-type field effect transistors.

5. The method of claim 1, wherein forming at least one of the first relaxed monocrystalline semiconductor layer, the second relaxed monocrystalline semiconductor layer, the first strained monocrystalline semiconductor layer, and the second strained monocrystalline semiconductor layer comprises forming by molecular beam epitaxy.

6. A method for producing a field effect transistor with a heterostructure, comprising: preparing a carrier material, wherein the carrier material includes a 3 to 5 nm thick relaxed monocrystalline semiconductor layer made of a first semiconductor material as a topmost layer; forming a 3 to 5 nm thick strained monocrystalline semiconductor layer at a surface of the relaxed monocrystalline semiconductor layer, wherein the strained monocrystalline semiconductor layer comprises a semiconductor alloy including the first semiconductor material and at least one second semiconductor material and wherein a proportion x of the second semiconductor material is settable; forming a gate insulation layer at a surface of the strained monocrystalline semiconductor layer; forming a gate layer at a surface of the gate insulation layer; patterning the gate insulation layer and the gate layer to form a patterned gate stack; and carrying out an ion implantation to form drain/source regions using the patterned gate stack as a mask in at least the strained monocrystalline semiconductor layer, wherein the drain/source regions define an undoped channel region.

7. The method of claim 6, further comprising selecting the layer thicknesses of the respective semiconductor layers to ensure a stable strain for the proportions of the at least one second semiconductor material in the semiconductor alloy of up to approximately 0.5.

* * * * *